(12) United States Patent
Iizuka et al.

(10) Patent No.: US 8,854,142 B2
(45) Date of Patent: Oct. 7, 2014

(54) BIAS CIRCUIT AND POWER AMPLIFIER HAVING THE SAME

(75) Inventors: Shinichi Iizuka, Gyunggi-do (KR); Youn Suk Kim, Gyunggi-do (KR); Jun Goo Won, Gyunggi-do (KR); Myeong Woo Han, Gyunggi-do (KR); Young Jean Song, Gyunggi-do (KR); Ju Young Park, Gyunggi-do (KR); Ki Joong Kim, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 72 days.

(21) Appl. No.: 13/565,417

(22) Filed: Aug. 2, 2012

(65) Prior Publication Data

US 2013/0321086 A1   Dec. 5, 2013

(30) Foreign Application Priority Data

May 29, 2012   (KR) .......................... 10-2012-0056853

(51) Int. Cl.
*H03F 3/04*   (2006.01)

(52) U.S. Cl.
USPC ........................................... 330/296; 330/285

(58) Field of Classification Search
USPC ................... 330/285, 296, 267, 273
See application file for complete search history.

(56) References Cited

U.S. PATENT DOCUMENTS 7,504,887 B2   3/2009   Masuda et al.
8,040,186 B2 *  10/2011  Nakayama et al. ........... 330/285

* cited by examiner

*Primary Examiner* — Hieu Nguyen
(74) *Attorney, Agent, or Firm* — McDermott Will & Emery LLP

(57) ABSTRACT

There are provided a bias circuit supplying different levels of bias power according to respective power modes through a simple circuit configuration, and a power amplifier having the same. The bias circuit includes: a bias setting unit setting a bias power voltage level by switching reference power having a pre-set voltage level determined according to a pre-set power mode; and a bias supply unit including a switching element performing switching according to the setting of the bias setting unit and supplying bias power having a voltage level determined according to a switching operation of the switching element.

14 Claims, 4 Drawing Sheets

BIAS CIRCUIT AND POWER AMPLIFIER HAVING THE SAME

CROSS-REFERENCE TO RELATED APPLICATIONS

This application claims the priority of Korean Patent Application No. 10-2012-0056853 filed on May 29, 2012, in the Korean Intellectual Property Office, the disclosure of which is incorporated herein by reference.

BACKGROUND OF THE INVENTION

1. Field of the Invention

The present invention relates to a bias circuit providing different levels of bias power according to various power modes and a power amplifier having the same.

2. Description of the Related Art

In general, a power amplifier is a device supplying power to a load, and since it is positioned in a final stage of an amplifier circuit, it may also be referred to as a final stage amplifier.

It is important for a power amplifier to effectively supply power to a load without distortion, so a power transistor may be used as an amplifying element thereof.

Meanwhile, due to recent explosive growth in the wireless communications device market, large numbers of people can transmit and receive information through portable communications terminals, regardless of time and place. However, as large numbers of people are increasingly using wireless communications, diverse wireless services may be requested, and in order to meet the demand for diverse wireless services, portable terminals provide diverse applications; however, maximum talk time may be reduced.

The shortening of the maximum talk time is mainly due to power consumption and is caused by the limited battery capacity of portable terminals. However, an increase in battery capacity may lead to an increase in the volume of portable terminals, therefore failing to satisfy user demand for lighter, thinner, shorter, and smaller portable terminals. Thus, portable terminal battery power is required to be used effectively.

The foregoing power amplifier may also be employed in a portable terminal to be used for wireless communications and may be used to amplify the power of a transmitted and received signal. Thus, in order to use the battery power of a portable terminal effectively, the power amplifier is also required to use power effectively. Thus, a power amplifier may selectively operate in either a high power mode or a low power mode.

A power amplifier receives bias power in order to perform an amplifying operation. In general, a power amplifier receives the same amount of bias power while operating in both the high power mode and the low power mode, causing a problem in which power usage is ineffective.

In order to solve the foregoing problem, a technique of supplying different levels of bias power according to various power modes has been disclosed in the related art document, but in this technique, a separate bias circuit is provided for each power mode, thereby increasing a circuit area and thus causing a further problem in which the volume of a portable terminal is increased.

RELATED ART DOCUMENT (Patent Document 1) Korean Patent Laid-Open Publication No. 10-2005-0017617

SUMMARY OF THE INVENTION

An aspect of the present invention provides a bias circuit providing different levels of bias power in respective power modes through a simple circuit configuration, and a power amplifier having the same.

According to an aspect of the present invention, there is provided a bias circuit including: a bias setting unit setting a bias power voltage level by switching reference power having a pre-set voltage level determined according to a pre-set power mode; and a bias supply unit including a switching element performing switching according to the setting of the bias setting unit and supplying bias power having a voltage level determined according to a switching operation of the switching element.

The switching element may be a single supply transistor.

The bias setting unit may include a first transistor switched on or off according to the pre-set power mode; a second transistor switched on as the first transistor is switched on and causing a base voltage of the supply transistor to be increased; and a third transistor switched on as the first transistor is switched off and causing the base voltage of the supply transistor to be lowered.

The first transistor may be switched on when the pre-set power mode is a high power mode, and may be switched off when the pre-set power mode is a low power mode. The second transistor may be switched on when the pre-set power mode is a high power mode, and may be switched off when the pre-set power mode is a low power mode. The third transistor may be switched on when the pre-set power mode is a low power mode, and may be switched off when the pre-set power mode is a high power mode.

The first transistor may have a base receiving a signal containing information regarding the pre-set power mode through a resistor, an emitter connected to a ground, and a collector connected to an emitter of the second transistor and a base of the third transistor through a resistor, the emitter of the second transistor may be connected to the ground through a resistor, the third transistor may have an emitter connected to the ground, a collector receiving the reference power through a resistor, and the base connected to the emitter of the second transistor, the bias setting unit may further include a capacitor for charging the reference power, and the second transistor may have a base connected to the capacitor to receive the power charged in the capacitor as the third transistor is switched on or off.

The second transistor may have a collector receiving driving power having a pre-set voltage level, and the supply transistor may have a collector receiving the driving power, a base receiving the power charged in the capacitor, and an emitter supplying the bias power through a resistor.

The second transistor may have a collector receiving the reference power, and the supply transistor may have a collector receiving driving power having a pre-set voltage level, a base receiving the power charged in the capacitor, and an emitter supplying the bias power through a resistor.

The second transistor may have a collector receiving driving power having a pre-set voltage level, and the supply transistor may have a collector receiving the reference power, a base receiving the power charged in the capacitor, and an emitter supplying the bias power through a resistor.

The second transistor may have a collector receiving the reference power, and the supply transistor may have a collector receiving the reference power, a base receiving the power charged in the capacitor, and an emitter supplying the bias power through a resistor.

According to another aspect of the present invention, there is provided a power amplifier including: a bias circuit including a bias setting unit setting a bias power voltage level by switching reference power having a pre-set voltage level determined according to a pre-set power mode, and a bias supply unit including a supply transistor performing switching according to the setting of the bias setting unit and supplying bias power having a voltage level determined according to a turn-on degree of the supply transistor; and an amplifying unit receiving the bias power from the bias circuit unit to amplify a power level of an input signal.

The power amplifier may further include an input matching circuit matching impedance of a signal transmission path between an input signal terminal to which the input signal is input and the amplifying unit.

The power amplifier may further include an output matching circuit matching impedance of a signal transmission path between an output signal terminal from which an output signal amplified by the amplifying unit is output and the amplifying unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
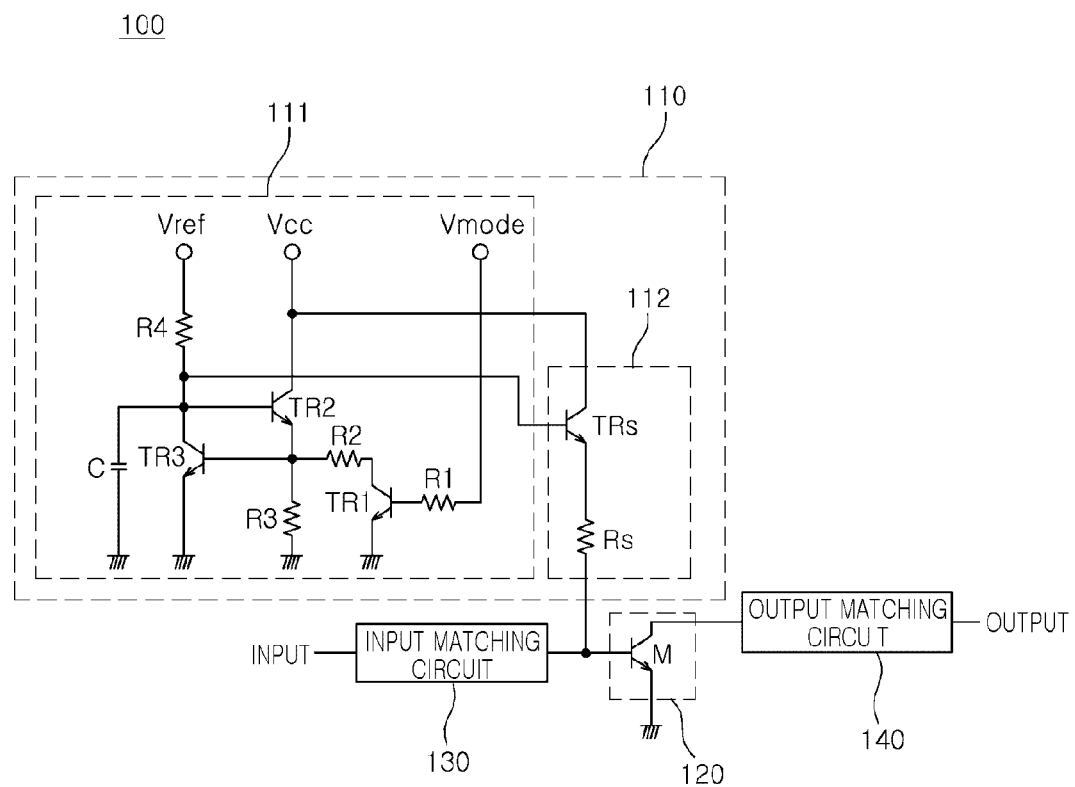
FIG. 1 is a view schematically illustrating the configuration of a power amplifier according to a first embodiment the present invention.

Hereinafter, embodiments will be described in detail with reference to the accompanying drawings so that they can be easily practiced by those skilled in the art to which the present invention pertains.

However, in describing embodiments of the present invention, detailed descriptions of well-known functions or constructions will be omitted so as not to obscure the description of the present invention with unnecessary detail.

In addition, like or similar reference numerals denote parts performing similar functions and actions throughout the drawings.

It will be understood that when an element is referred to as being "connected to" another element, it can be directly connected to the other element or may be indirectly connected with the other element with element (s) interposed therebetween.

In addition, unless explicitly described to the contrary, the word "comprise" and variations such as "comprises" or "comprising," will be understood to imply the inclusion of stated elements but not the exclusion of any other elements.

Embodiments of the present invention will now be described in detail with reference to the accompanying drawings.

FIG. 1 is a view schematically illustrating the configuration of a power amplifier according to a first embodiment the present invention.

With reference to FIG. 1, a power amplifier 100 according to the first embodiment of the present invention may include a bias circuit 110 and an amplifying unit 120, and may further include an input matching circuit 130 and an output matching circuit 140.

The bias circuit 110 may include a bias setting unit 111 and a bias supply unit 112.

The bias setting unit 111 may include first, second, and third transistors TR1, TR2, and TR3, and further include a plurality of resistors R1, R2, R3, and R4, and a capacitor C.

The bias supply unit 112 may include a single supply transistor TRs and a resistor Rs.

The bias setting unit 111 may switch reference power Vref having a pre-set voltage level determined according to a pre-set power mode to set a bias power voltage level. The bias supply unit 112, including the supply transistor TRs performing switching according to a setting of the bias setting unit 111, supplies bias power having a voltage level determined according to a turn-on degree of the supply transistor TRs to the amplifying unit 120.

A circuit connection relationship of the bias circuit 110 will be described in detail as follows.

A base of the first transistor TR1 of the bias setting unit 111 may receive a power mode signal Vmode containing information regarding a power mode through the resistor R1, an emitter of the first transistor TR1 may be connected to a ground, and a collector of the first transistor TR1 may be connected to an emitter of the second transistor TR2 and a base of the third transistor TR3 through the resistor R2.

A collector of the second transistor TR2 may receive driving power Vcc having a pre-set voltage level, and the emitter of the second transistor TR2 may be connected to the ground through the resistor R3. A base of the second transistor TR2 may receive reference power Vref charged in the capacitor C.

A collector of the third transistor TR3 may receive the reference power Vref through the resistor R4, an emitter of the third transistor TR3 may be connected to the ground, and a base of the third transistor TR3 may be connected to the emitter of the second transistor TR2.

A collector of the supply transistor TRs of the bias supply unit 112 may receive the driving power Vcc, and a base of the supply transistor TRs may receive the reference power Vref through the resistor R4, and an emitter of the supply transistor TRs may provide pre-set bias power to the amplifying unit 120 through the resistor Rs.

The amplifying unit 120 may include an amplifying transistor M, and an input signal desired to be amplified may be input to a base of the amplifying transistor M, and the bias power from the bias supply unit 112 may be supplied to the base of the amplifying transistor M. An emitter of the amplifying transistor M may be connected to the ground, and a collector of the amplifying transistor M may output an amplified signal.

The input matching circuit 130 for matching impedance of a signal transmission path may be provided between an input signal terminal to which an input signal of the amplifying transistor M is input and the base of the amplifying transistor M. The output matching circuit 140 for matching impedance of a signal transmission path may be provided between an output signal terminal from which an output signal of the amplifying transistor M is output and the collector of the amplifying transistor M.

An operation of the bias circuit 110 will be described in detail with reference to FIG. 1.

First, a power mode signal Vmode for setting a power mode of the power amplifier 100 may be input to the bias setting unit 111. The power mode signal Vmode may indicate a high power mode or a low power mode. For example, in the case of the high power mode, the power mode signal Vmode may be a high level signal, and in the case of the low power mode, the power mode signal Vmode may be a low level signal. The high power mode may be a mode for amplifying an input signal to have a high power level, and the low power mode may be a mode for amplifying an input signal to have a low power level.

When the power mode signal Vmode indicating the high power mode is input to the base of the first transistor TR1, the first transistor TR1 is switched on and a current flowing through the first transistor TR1 is increased. Accordingly, the third transistor TR3 is switched off, a base voltage of the second transistor TR2 is increased to switch on the second transistor TR2, and a base voltage of the supply transistor TRs is increased to increase a base voltage of the amplifying transistor M of the amplifying unit 120. Namely, a voltage level of the bias power applied to the amplifying transistor M is increased.

Conversely, when the power mode signal Vmode indicating the low power mode is input to the base of the first transistor TR1, the first transistor TR1 is switched off and the third transistor TR3 is switched on, and the base voltage of the second transistor TR2 is not increased. Accordingly, the base voltage of the supply transistor TRs is not increased, and the base voltage of the amplifying transistor M is not increased. Namely, bias power having a low voltage level is applied to the amplifying transistor M.

As described above, bias power having a separate voltage level may be supplied to the amplifying unit according to the high power mode and the low power mode. Also, in setting and supplying bias power having a separate voltage level for each mode, bias power can be supplied through the single supply transistor according to the power mode setting, constituting a simple circuit, whereby power usage efficiency can be increased and fabrication costs can be reduced.

Figure 2:
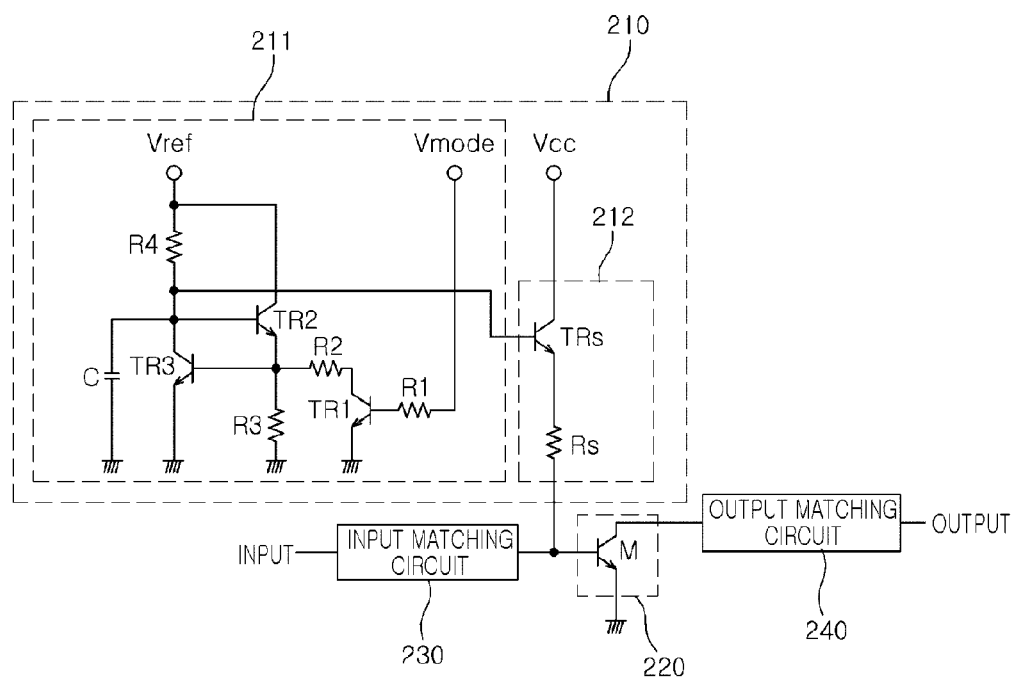
FIG. 2 is a view schematically illustrating the configuration of a power amplifier according to a second embodiment the present invention.
Figure 3:
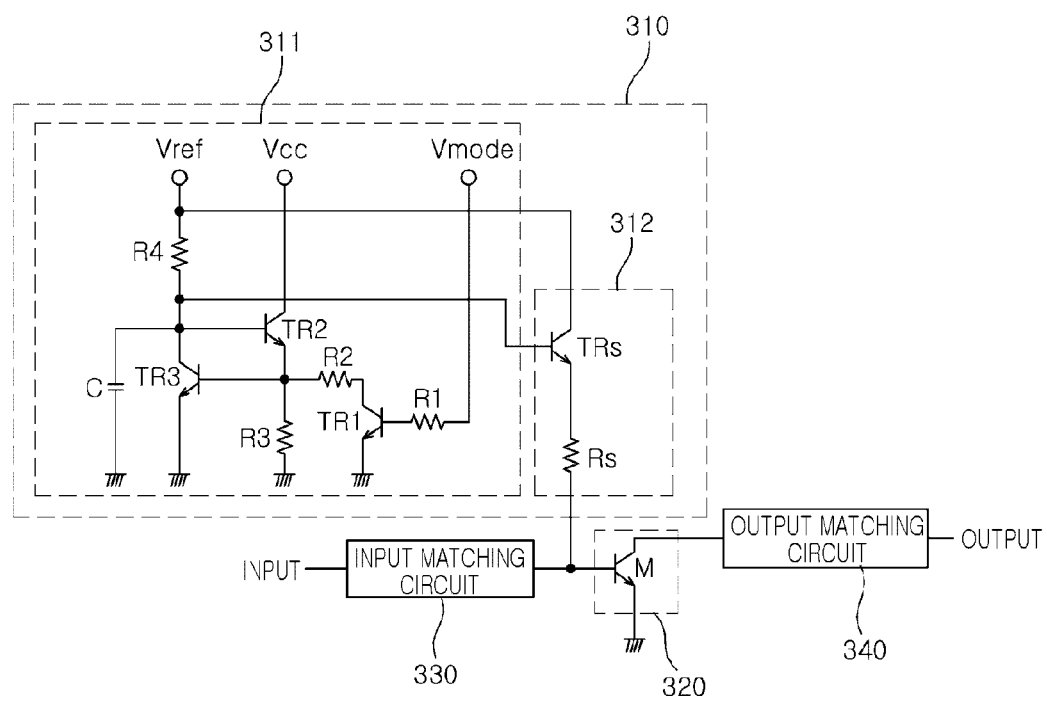
FIG. 3 is a view schematically illustrating the configuration of a power amplifier according to a third embodiment the present invention.
Figure 4:
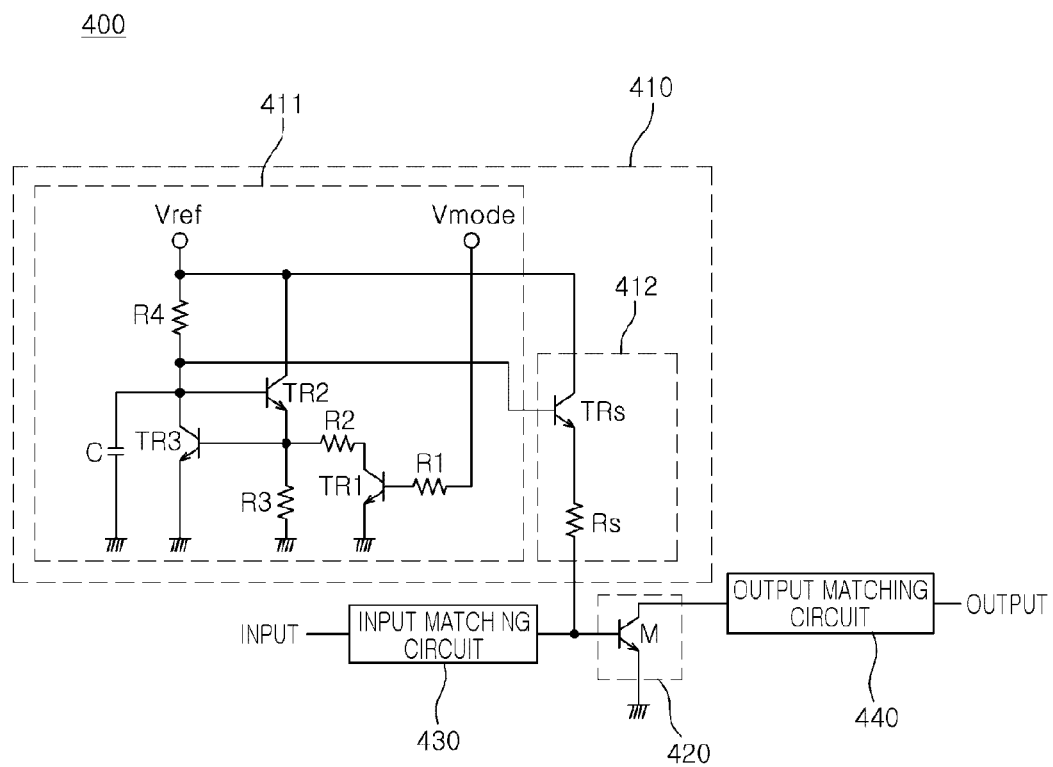
FIG. 4 is a view schematically illustrating the configuration of a power amplifier according to a fourth embodiment the present invention.

FIG. 2 is a view schematically illustrating the configuration of a power amplifier according to a second embodiment the present invention. FIG. 3 is a view schematically illustrating the configuration of a power amplifier according to a third embodiment the present invention. FIG. 4 is a view schematically illustrating the configuration of a power amplifier according to a fourth embodiment of the present invention.

With reference to FIG. 2, a bias setting unit 211 of a power amplifier 200 according to the second embodiment of the present invention may have a circuit connection such that reference power Vref is input to a collector of a second transistor TR2. With this configuration, power usage may be further reduced.

Similarly, with reference to FIGS. 3 and 4, bias supply units 312 and 412 of power amplifiers 300 and 400, according to third and fourth embodiments of the present invention, may have a circuit connection such that reference power Vref is input to a collector of a supply transistor TRs, or may have a circuit connection such that reference power Vref is input to a collector of a second transistor TR2 and the collector of the supply transistor TRs, whereby power usage can be further reduced.

Except for this, bias setting units 211, 311, and 411, bias supply units 212, 312, and 412, amplifying units 220, 320, and 420, input matching circuits 230, 330, and 430, and output matching circuits 240, 340, and 440 illustrated in FIGS. 2 through 4 are the same as or similar to the bias setting unit 111, the bias supply unit 112, the amplifying unit 120, the input matching circuit 130, and the output matching unit 140 illustrated in FIG. 1, so therefore a detailed description thereof will be omitted.

As described above, according to embodiments of the present invention, the bias circuit for supplying bias power to the amplifying unit is formed as a simple circuit and provides different levels of bias power according to respective power modes, whereby power consumption in a low power mode can be reduced, while reducing fabrication costs, thus increasing power usage efficiency.

As set forth above, according to embodiments of the invention, different levels of bias power are provided according to power modes through a simple circuit, whereby power consumption in a low power mode can be reduced, while reducing fabrication costs, thus increasing power usage efficiency.

While the present invention has been shown and described in connection with the embodiments, it will be apparent to those skilled in the art that modifications and variations can be made without departing from the spirit and scope of the invention as defined by the appended claims.

What is claimed is:

1. A bias circuit comprising:
   a bias setting unit setting a bias power voltage level by switching reference power having a pre-set voltage level determined according to a pre-set power mode; and
   a bias supply unit including a switching element performing switching according to the setting of the bias setting unit and supplying bias power having a voltage level determined according to a switching operation of the switching element, wherein the switching element is a supply transistor,
   the bias setting unit includes:
     a first transistor switched on or off according to the pre-set power mode, wherein the first transistor is switched on when the pre-set power mode is a high power mode, and is switched off when the pre-set power mode is a low power mode,
     a second transistor switched on as the first transistor is switched on and causing a base voltage of the supply transistor to be increased, wherein the second transistor is switched on when the pre-set power mode is a high power mode, and is switched off when the pre-set power mode is a low power mode,
     a third transistor switched on as the first transistor is switched off and causing the base voltage of the supply transistor to be lowered, wherein the third transistor is switched on when the pre-set power mode is a low power mode, and is switched off when the pre-set power mode is a high power mode, and
     a capacitor for charging the reference power, wherein the second transistor has a base connected to the capacitor to receive the power charged in the capacitor as the third transistor is switched on or off,
   wherein the second transistor has a collector receiving driving power having a pre-set voltage level, and
   wherein the supply transistor has a collector receiving the driving power, a base receiving the power charged in the capacitor, and an emitter supplying the bias power through a resistor.

2. The bias circuit of claim 1, wherein the first transistor has a base receiving a signal containing information regarding the pre-set power mode through a resistor, an emitter connected to a ground, and a collector connected to an emitter of the second transistor and a base of the third transistor through a resistor,
   the emitter of the second transistor is connected to the ground through a resistor, the third transistor has an emitter connected to the ground, a collector receiving the reference power through a resistor, and the base connected to the emitter of the second transistor.

3. The bias circuit of claim 2, wherein the second transistor has a collector receiving the reference power, and
the supply transistor has a collector receiving driving power having a pre-set voltage level, a base receiving the power charged in the capacitor, and an emitter supplying the bias power through a resistor.

4. The bias circuit of claim 2, wherein the second transistor has a collector receiving driving power having a pre-set voltage level, and
the supply transistor has a collector receiving the reference power, a base receiving the power charged in the capacitor, and an emitter supplying the bias power through a resistor.

5. The bias circuit of claim 2, wherein the second transistor has a collector receiving the reference power, and
the supply transistor has a collector receiving the reference power, a base receiving the power charged in the capacitor, and an emitter supplying the bias power through a resistor.

6. The bias circuit of claim 1, wherein the switching element is a single supply transistor.

7. The power amplifier of claim 6, wherein the first transistor has a base receiving a signal containing information regarding the pre-set power mode through a resistor, an emitter connected to a ground, and a collector connected to an emitter of the second transistor and a base of the third transistor through a resistor,
the emitter of the second transistor is connected to the ground through a resistor,
the third transistor has an emitter connected to the ground, a collector receiving the reference power through a resistor, and the base connected to the emitter of the second transistor.

8. The power amplifier of claim 7, wherein the second transistor has a collector receiving the reference power, and
the supply transistor has a collector receiving driving power having a pre-set voltage level, a base receiving the power charged in the capacitor, and an emitter supplying the bias power through a resistor.

9. The power amplifier of claim 7, wherein the second transistor has a collector receiving driving power having a pre-set voltage level, and
the supply transistor has a collector receiving the reference power, a base receiving the power charged in the capacitor, and an emitter supplying the bias power through a resistor.

10. The power amplifier of claim 7, wherein the second transistor has a collector receiving the reference power, and
the supply transistor has a collector receiving the reference power, a base receiving the power charged in the capacitor, and an emitter supplying the bias power through a resistor.

11. A power amplifier comprising:
a bias circuit including a bias setting unit setting a bias power voltage level by switching reference power having a pre-set voltage level determined according to a pre-set power mode, and a bias supply unit including a supply transistor performing switching according to the setting of the bias setting unit and supplying bias power having a voltage level determined according to a turn-on degree of the supply transistor; and
an amplifying unit receiving the bias power from the bias circuit unit to amplify a power level of an input signal,
wherein the bias setting unit includes:
a first transistor switched on or off according to the pre-set power mode, wherein the first transistor is switched on when the pre-set power mode is a high power mode, and is switched off when the pre-set power mode is a low power mode,
a second transistor switched on as the first transistor is switched on and causing a base voltage of the supply transistor to be increased, wherein the second transistor is switched on when the pre-set power mode is a high power mode, and is switched off when the pre-set power mode is a low power mode,
a third transistor switched on as the first transistor is switched off and causing the base voltage of the supply transistor to be lowered, wherein the third transistor is switched on when the pre-set power mode is a low power mode, and is switched off when the pre-set power mode is a high power mode, and
a capacitor for charging the reference power, wherein the second transistor has a base connected to the capacitor to receive the power charged in the capacitor as the third transistor is switched on or off,
wherein the second transistor has a collector receiving driving power having a pre-set voltage level, and
wherein the supply transistor has a collector receiving the driving power, a base receiving the power charged in the capacitor, and an emitter supplying the bias power through a resistor.

12. The power amplifier of claim 11, further comprising an input matching circuit matching impedance of a signal transmission path between an input signal terminal to which the input signal is input and the amplifying unit.

13. The power amplifier of claim 11, further comprising an output matching circuit matching impedance of a signal transmission path between an output signal terminal from which an output signal amplified by the amplifying unit is output and the amplifying unit.

14. The power amplifier of claim 11, wherein the supply transistor is a single switching element.

* * * * *